United States Patent [19]

Porter

[11] Patent Number: 5,581,441
[45] Date of Patent: Dec. 3, 1996

[54] ELECTRICALLY-OPERATED HEAT EXCHANGER RELEASE MECHANISM

[75] Inventor: Warren W. Porter, Escondido, Calif.

[73] Assignee: AT&T Global Information Solutions Company, Dayton, Ohio

[21] Appl. No.: 473,699

[22] Filed: Jun. 7, 1995

[51] Int. Cl.⁶ .................................................. H05K 7/20
[52] U.S. Cl. .................. 361/701; 62/259.2; 165/104.33; 257/719; 361/719; 411/909
[58] Field of Search ............................ 62/51.1, 51.2, 62/62.2, 259.2; 165/80.3, 76, 80.4, 185, 104.33; 174/16.3; 211/41; 257/706, 718, 719, 727; 361/688, 689, 691, 696, 699, 700, 701, 702, 704, 717–719; 411/909; 403/28, 404; 29/592.1, 890.031, 890.035

[56] References Cited

U.S. PATENT DOCUMENTS

| | | | |
|---|---|---|---|
| 4,821,147 | 4/1989 | Jacobs | 361/388 |
| 4,899,543 | 2/1990 | Romanelli | 60/527 |
| 5,010,949 | 4/1991 | Dehaine | 165/76 |
| 5,132,873 | 7/1992 | Nelson | 361/385 |
| 5,365,749 | 11/1994 | Porter . | |
| 5,371,753 | 12/1994 | Adsett | 372/36 |

OTHER PUBLICATIONS

Hodgson, Darel E., "Using Shape Memory Alloys", 1988, Shape Memory Applications, Inc., Santa Clara, California (entire document) pp. 1–37.

*Primary Examiner*—Gerald P. Tolin
*Attorney, Agent, or Firm*—Merchant, Gould, Smith, Edell, Welter & Schmidt

[57] ABSTRACT

A heat operated release mechanism. The release mechanism is controllable to allow a heat exchanger to be firmly held in place over a heat producing element and effortlessly withdrawn when so desired. A spring is disposed above a heat producing element forming a variable-volume cavity between the spring and the heat producing element. The spring applies pressure to a heat exchanger inserted into the cavity. A memory metal plate is disposed between the spring and the heat exchanger. The memory metal plate has a selectable first shape at a low temperature for allowing the spring to apply pressure to the heat exchanger and a selectable second shape at elevated temperatures for displacing the spring to increase the volume of the cavity. Finally, a controllable heater is disposed between the spring and the memory metal plate for applying heat to the memory metal to select the second shape thereby increasing the volume of the cavity to facilitate insertion and withdrawal of the heat exchanger. Thus, a high spring force is provided while still facilitating insertion and withdrawal of a heat exchanger without the use of tools.

17 Claims, 3 Drawing Sheets

ELECTRICALLY-OPERATED HEAT EXCHANGER RELEASE MECHANISM

BACKGROUND OF THE INVENTION

1. Field of the Invention

This invention relates in general to an electrically-operated heat exchanger release mechanism, and more particularly, to a memory metal apparatus for providing a high engagement force between a heat exchanger and a central processing unit (CPU) while facilitating insertion and withdrawal of a printed circuit board (PCB).

2. Description of Related Art

It is common knowledge that CMOS integrated circuits can be chilled to sub-zero temperatures, thus creating an environment that allows higher operating frequencies. A common method of effectively chilling a CPU is to hold a heat exchanger (HEX) in intimate contact with the CPU's heated surface. One means of biasing the two surfaces together is to provide appropriate spring action. However, the best heat transfer is achieved when the spring pressure is high.

Further, a system PCB can normally be inserted and withdrawn from a card cage merely by pushing or pulling. Any other method of inserting or withdrawing the PCB is highly objectionable, especially if a tool is required. In most designs, the CPU is part of a PCB assembly. It is thus necessary to engage/disengage a CPU with/from its heat exchanger when the system PCB is inserted or withdrawn.

It should therefore be apparent that there are two conflicting requirements. First, optimum heat transfer is achieved when the spring pressure is high. Secondly, it is desirable to insert and withdraw the PCB from a card cage merely by pushing or pulling. Nevertheless, a high spring pressure between the CPU surface and the heat exchanger does not facilitate PCB insertion and withdrawal. On the contrary, the required high spring pressure makes it difficult to insert or withdraw the PCB. Furthermore, reducing spring pressure to ease insertion and withdrawal compromises heat transfer characteristics.

Accordingly, mechanisms have been designed to solve this dilemma. However, prior designs have exhibited disadvantages that make them undesirable. They are generally bulky, require manual operation to secure and release, easily broken, difficult to repair, and thus become stuck and are usually expensive.

It can be seen then that there is a need for providing the necessary high spring force while still facilitating insertion and withdrawal of the PCB.

It can also be seen that there is a need for a means for maximizing cooling while simultaneously facilitating insertion and withdrawal of the PCB without the use of tools.

SUMMARY OF THE INVENTION

To overcome the limitations in the prior art described above, and to overcome other limitations that will become apparent upon reading and understanding the present specification, the present invention discloses an electrically operated release mechanism.

The present invention solves the above-described problems by providing a release mechanism which is controllable to thereby allow a heat exchanger to be firmly held in place over an integrated circuit such as a central processing unit (CPU) and effortlessly withdrawn when so desired. The heat exchanger may be coupled to a cabinet assembly so that the release allows the PCB assembly to be inserted and withdrawn from the cabinet.

A system in accordance with the principles of the present invention comprises a spring disposed above an integrated circuit thereby forming a variable-volume cavity between the spring and the integrated circuit, the spring applying pressure to a heat exchanger inserted into the cavity. A memory metal plate is disposed between the spring and the heat exchanger. The memory metal plate has a selectable first shape at a CPU operating temperature for allowing the spring to apply pressure to the heat exchanger and a selectable second shape at elevated temperatures for displacing the spring to increase the volume of the cavity. Finally, a controllable heater is disposed between the spring and the memory metal plate for applying heat to the memory metal to select the shape of the memory metal plate thereby increasing the volume of the cavity to facilitate insertion and withdrawal of the heat exchanger.

One object of the present invention is to provide a high spring force while still facilitating insertion and withdrawal of a heat exchanger or printed circuit board (PCB).

Another object of the present invention is to maximize cooling of an integrated circuit while simultaneously facilitating insertion and withdrawal of the heat exchanger or PCB without the use of tools.

Another object of the present invention is to provide a spring having sufficient force to displace the memory metal plate such that the heat exchanger is pressed against the surface of the integrated circuit with sufficient force to maximize heat transfer.

Still another object of the present invention is to use a memory metal plate such that the resultant heat causes the memory metal plate to return to an original undeformed shape, wherein the memory metal plate displaces the spring and creates a gap between the memory metal plate and the heat exchanger.

Yet another object of the present invention is to dispose the insulation over the engaging means to prevent formation of condensation on cold HEX surfaces.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a section of a memory metal alloy and an associated heater placed between a spring and a heat exchanger. Normally the spring pressure displaces the memory metal thus applying appropriate pressure between the heat exchanger and a heat producing element such as a CPU or other integrated circuit. When the heater is activated the memory metal returns to its initial shape thus displacing the spring and thereby releasing the pressure.

Memory metal is an alloy whose principal characteristic is to return from a deformed to an original shape when it is heated to an appropriate temperature. The temperature is relatively low, e.g., less than 100 degrees C. The operating temperature is changed by varying the ratio of alloying constituents.

Figure 1:
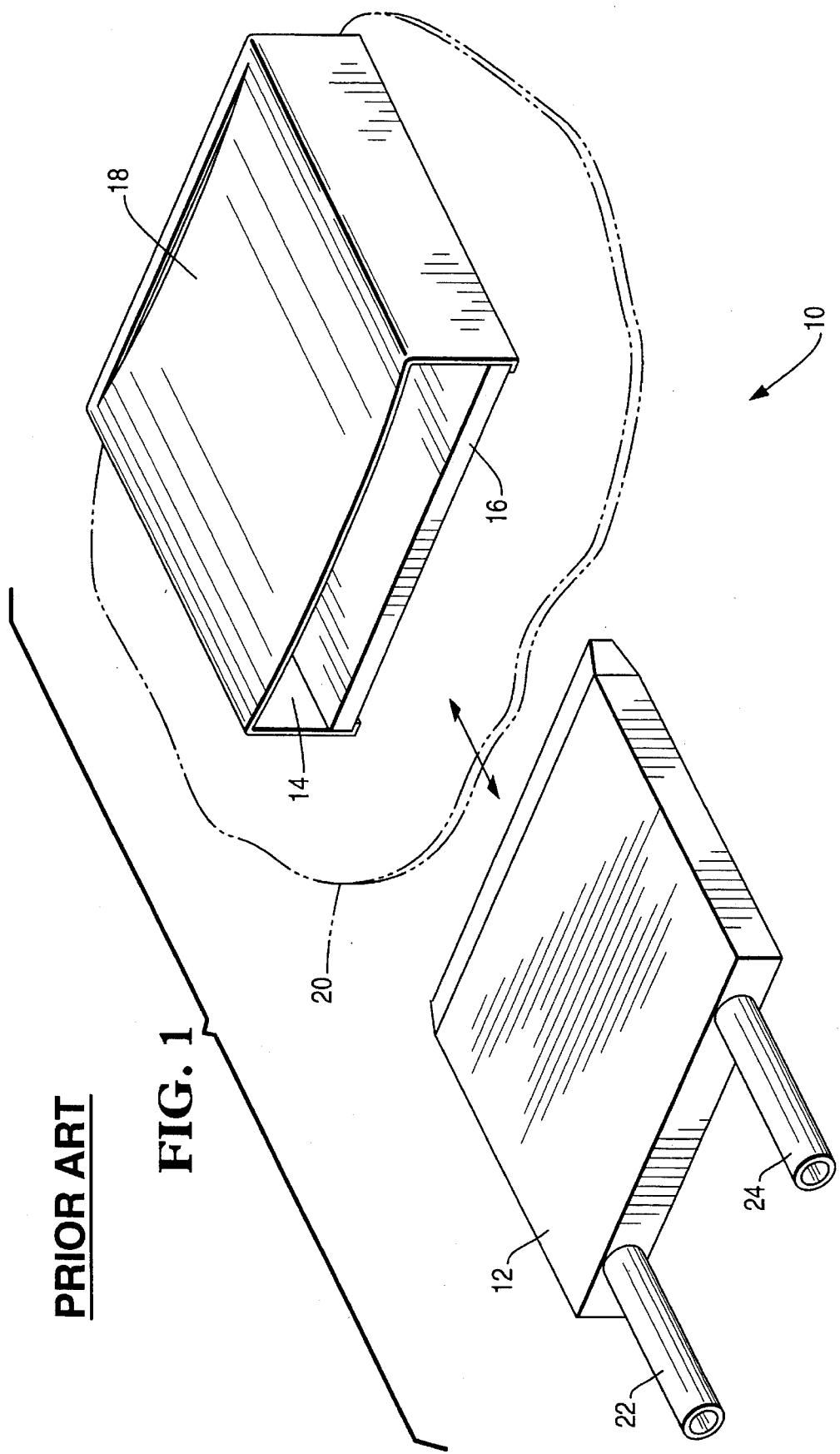
FIG. 1 is a perspective view of an unimproved release mechanism for the evaporator/heat exchanger system with HEX disengaged.

FIG. 1 shows a perspective view of an unimproved evaporator/heat exchanger system 10. In FIG. 1, a heat exchanger 12 is poised to be inserted into an enclosed volume or cavity 14 formed between the inner surfaces of a CPU 16 and a retainer/spring 18. The cavity formed by the CPU 16 and the spring 18 has a variable volume and is coupled to a PCB or mother assembly 20. The refrigerant enters and exits the heat exchanger 12 via the refrigerant conduits 22, 24.

To enter the space 14 between the CPU 16 and the spring 18, the heat exchanger 12 must displace the spring 18. If the force of the spring 18 is high enough to create sufficient pressure between the heat exchanger 12 and the CPU 16, then it is difficult to insert the heat exchanger 12. This problem is exacerbated when there are multiple CPU's 16 on a mother or PCB assembly 20.

Figure 2:
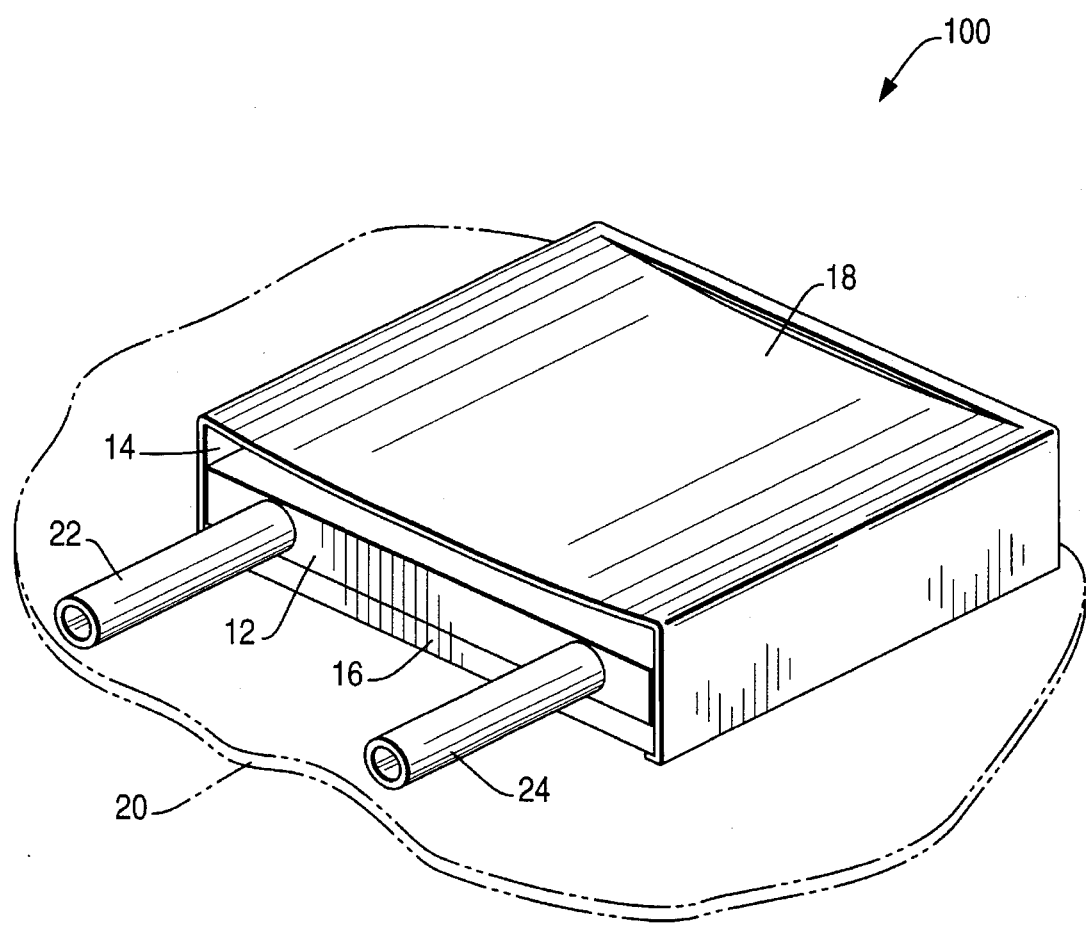
FIG. 2 is an assembled view of the unimproved release mechanism with the heat exchanger inserted therein.

For clarity, FIG. 2 illustrates an assembled view of the unimproved CPU module 100. The heat exchanger 12 is inserted into an enclosed volume 14 between the inner surfaces of the CPU 16 and retainer/spring 18. FIG. 2 illustrates that the spring 18 must be displaced to remove the heat exchanger 12. If the force of the spring 18 is high enough to create sufficient pressure between the heat exchanger 12 and the CPU 16, then the heat exchanger cannot be easily pulled out of the volume 14. Thus, some type of tool or excessive objectionable force must be used to displace the spring 18 away from the heat exchanger 12.

Figure 3:
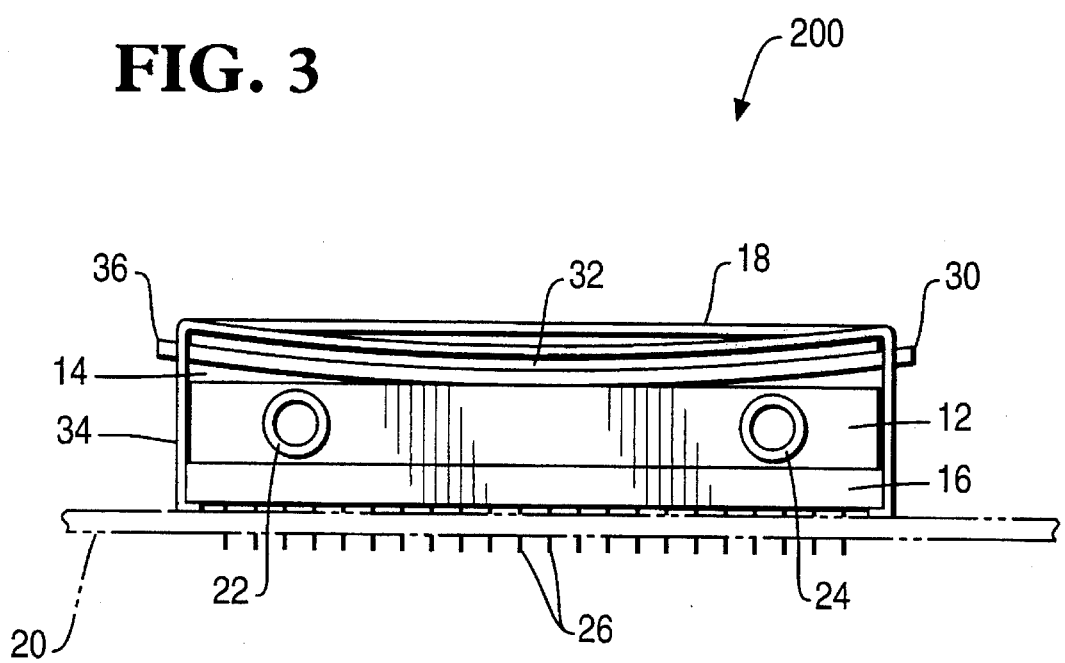
FIG. 3 is an end view of a release mechanism shown in the spring loaded position in accordance with the present invention.

FIG. 3 shows an end view of a CPU module 200 improved in accordance with the present invention. The heat exchanger 12 is shown inserted into the enclosed volume 14 between the inner surfaces of CPU 16 and retainer/spring 18. Again, the enclosed volume formed by the CPU 16 and the spring 18 is coupled to a PCB 20. In addition, the refrigerant conduits 22, 24 are clearly visible. Connector pins 26 of a socket for receiving the CPU 16 are shown soldered to and protruding through the PCB 20.

A memory metal plate 30 and a related electrical heater 32 are imposed between the spring 18 and the heat exchanger 12. The memory metal plate 30 is supported in slots (not visible) in the sidewalls 34 of the spring 18. Thus, a portion 36 of the memory metal plate 30 extends beyond the sidewalls 34 on each side of spring 18.

At ambient, or chilled temperatures, the force of spring 18 is sufficient to displace the memory metal plate 30 such that the heat exchanger 12 is pressed with sufficient force against the surface of the CPU 16. Accordingly, appropriate heat transfer between the heat exchanger 12 and the CPU 16 is assured.

Figure 4:
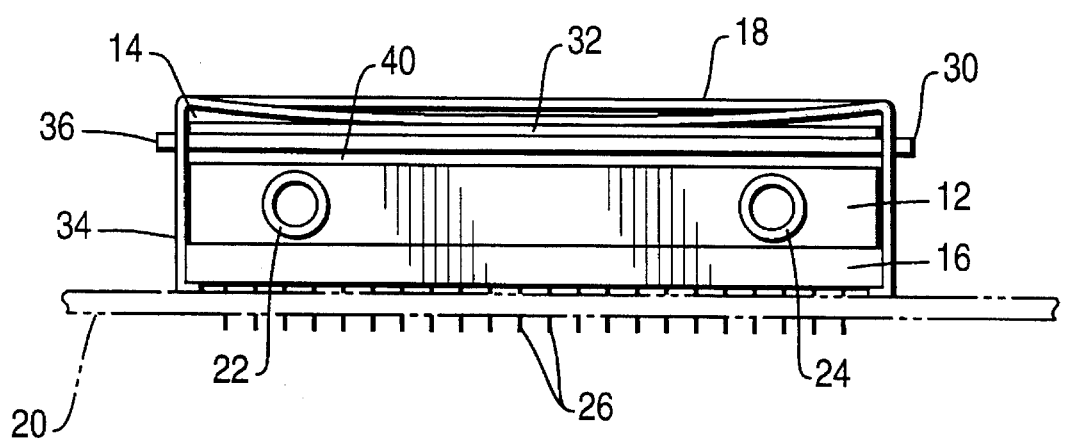
FIG. 4 is an end view of a release mechanism shown in the released position in accordance with the present invention.

FIG. 4 illustrates the CPU module in accordance with the present invention after the electrical heater 32 is activated. Again, the heat exchanger 12 is shown inserted into the enclosed volume 14 between the inner surfaces of CPU 16 and retainer/spring 18. The memory metal plate 30 and the electrical heater 32 are also shown disposed between the spring 18 and the heat exchanger 12.

However, as the heater 32 is energized, the resultant heat causes the memory metal plate 30 to return to its original undeformed shape, thus displacing the spring 18 and creating a gap 40 between the memory metal plate 30 and the heat exchanger 12. The resulting gap 40 between the memory metal plate 30 and the heat exchanger 12 allows the heat exchanger 12 to be easily inserted or withdrawn.

As described above, it is clear that the heat exchanger may be inserted or withdrawn. However, it is to be understood that this embodiment is presented for illustration only and is not meant to limit the invention. Those skilled in the art will recognize that other embodiments incorporating the teaching of the present invention are possible without departing from the invention. For example, if the heat exchanger is coupled to a fixed assembly such as a system cabinet, the release mechanism may allow the PCB assembly to be inserted and withdrawn from the system cabinet.

In summary, the described invention facilitates insertion and withdrawal of a heat exchanger from a CPU module. During ambient and chilled operating temperatures, a spring displaces a memory metal element so that sufficient force between mating surfaces allows appropriate heat transfer between the heat exchanger and a CPU. When insertion or withdrawal of the heat exchanger is desired, an electrical heater is energized such that the memory element returns to its original shape. The spring is thus displaced such that the spring pressure is released. The heat exchanger is thereby easily inserted or withdrawn.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A thermally operated release mechanism, comprising:
    an engaging means, disposed in a spaced apart relation to a heat producing element, the spaced apart relation of the heat producing element and the engaging means forming a cavity therebetween, the engaging means comprising support sidewalls and applying pressure to a heat exchanger when the heat exchanger is placed within the cavity to increase contact between the heat exchanger and the heat producing element thereby maximizing cooling of the heat producing element; and
    memory metal means, disposed between the engaging means and the heat producing element, the memory metal means being supported in slots disposed in the support sidewalls of the engaging means and having two selectable shapes, a first shape being assumed at a low temperature allowing the engaging means to apply pressure to the heat exchanger when the heat exchanger is inserted within the cavity and a second shape, in opposition to the engaging means, being assumed at an elevated temperature, the second shape displacing the engaging means to allow the heat exchanger to be removed from and inserted within the cavity.

2. The release mechanism of claim 1 wherein the memory metal means further comprises a controllable heater attached to a memory metal plate, the controllable heater applying heat to the memory metal to select the second shape thereby increasing the volume of the cavity to facilitate insertion and withdrawal of the heat exchanger.

3. The release mechanism of claim 1 wherein the enclosed cavity formed by the heat producing element and the engaging means is coupled to a PCB.

4. The release mechanism of claim 3 wherein a plurality of heat producing elements are mounted to the PCB.

5. The release mechanism of claim 3 wherein the selection of the second shape displaces the engaging means to allow the PCB and engaging means to be separated from the heat exchanger.

6. The release mechanism of claim 1 wherein the force of the engaging means is sufficient to displace the memory metal means such that the heat exchanger is pressed with sufficient force against the surface of the heat producing element.

7. The release mechanism of claim 2 wherein the resultant heat causes the memory metal plate to return to an original undeformed shape, the memory metal plate displacing the engaging means and creating a gap between the memory metal plate and the heat exchanger.

8. The release mechanism of claim 7 wherein the gap between the memory metal plate and the heat exchanger facilitates the insertion and withdrawal of the heat exchanger.

9. A heat operated release mechanism, comprising:

a spring disposed in a spaced apart relation to a heat producing element forming a variable-volume cavity therebetween, the spring applying pressure to a heat exchanger when the heat exchanger is inserted into the cavity;

a memory metal plate, disposed between the spring and the heat exchanger inserted into the cavity, the memory metal plate having a selectable first shape at ambient temperature for allowing the spring to apply pressure to the heat exchanger and a selectable second shape at elevated temperatures for displacing the spring to increase the volume of the cavity; and a controllable heater, disposed between the spring and the memory metal plate, for applying heat to the memory metal to select the second shape thereby increasing the volume of the cavity to facilitate insertion and withdrawal of the heat exchanger.

10. The release mechanism of claim 9 wherein the enclosed cavity formed by the heat producing element and the spring is coupled to a mother assembly.

11. The release mechanism of claim 10 wherein a plurality of heat producing elements are mounted to the mother assembly.

12. The release mechanism of claim 10 wherein selection of the second shape displaces the spring to allow the mother assembly to be separated from the heat exchanger.

13. The release mechanism of claim 9 wherein the spring comprises support sidewalls and the memory metal plate is supported in slots disposed in the support sidewalls of the spring.

14. The release mechanism of claim 9 wherein the force of the spring is sufficient to displace the memory metal means such that the heat exchanger is pressed with sufficient force against the surface of the heat producing element.

15. The release mechanism of claim 9 wherein the resultant heat causes the memory metal plate to return to an original undeformed shape, the memory metal plate displacing the spring and creating a gap between the memory metal plate and the heat exchanger.

16. The release mechanism of claim 15 wherein the gap between the memory metal plate and the heat exchanger facilitates the insertion and withdrawal of the heat exchanger.

17. A method of operating a release mechanism, comprising the steps of:

signalling a heater to apply heat to a metal memory plate, disposed in a cavity formed by a spaced apart relation between an engaging means and a heat producing element, to select a first shape for the memory metal plate for displacing the engaging means to increase the volume of the cavity thereby allowing a heat exchanger to be inserted therein;

terminating the signalling to the heater applying the heat to the memory metal plate to select a second shape for the memory metal plate for allowing the engaging means to apply sufficient pressure to the heat exchanger to maximize heat transfer from the heat producing element to the heat exchanger; and repeating the signalling to the heater to apply heat to the metal memory plate to select the first shape for the memory metal plate for displacing the engaging means to increase the volume of the cavity thereby allowing the heat exchanger to be withdrawn therefrom.

* * * * *